United States Patent [19]
Tjhia et al.

[11] Patent Number: 5,482,819
[45] Date of Patent: Jan. 9, 1996

[54] PHOTOLITHOGRAPHIC PROCESS FOR REDUCING REPEATED DEFECTS

[75] Inventors: Eddy Tjhia, Sunnyvale; Chi Lin, Milpitas; Anjali Anagol-Subbarao, San Jose, all of Calif.

[73] Assignee: National Semiconductor Corporation, Santa Clara, Calif.

[21] Appl. No.: 223,255

[22] Filed: Apr. 4, 1994

[51] Int. Cl.$^6$ ........................................ G03F 7/20
[52] U.S. Cl. ..................... 430/394; 430/311; 430/322; 430/396
[58] Field of Search ................ 430/22, 311, 322, 430/394, 396, 397

[56] References Cited

U.S. PATENT DOCUMENTS

| 5,208,124 | 5/1993 | Sporon-Fiedler | 430/296 |
| 5,308,741 | 5/1994 | Kemp | 430/396 |

OTHER PUBLICATIONS

D. L. Smythe et al., "Double Reticle Method of Eliminating Repeated Defects In KSI Masks," Kodak Microelectronics Seminar Proceedings, Oct. 3–5, 1976, pp. 100–105.

Primary Examiner—Kathleen Duda
Attorney, Agent, or Firm—Skjerven, Morrill, MacPherson, Franklin & Friel; Brian D. Ogonowsky

[57] ABSTRACT

A photolithographic process for forming a lead frame pattern or other pattern is described. In the preferred embodiment, a mask approximately 12 inches by 12 inches contains two nearly identical patterns: a first lead frame pattern is provided on one half of the mask, and a second lead frame pattern, having features reduced by 0.3 mil, is provided on the other half of the mask. The first pattern is positioned over a copper web having a layer of photoresist laminated on it, and ultraviolet light is transmitted through the first pattern. The photoresist is thus exposed by a first image formed by the first pattern. While the copper web remains stationary, the mask is moved perpendicular to the length of the copper web so that the second pattern now forms a second image overlying the photoresist pattern from the first image. The photoresist layer is then exposed by the second image. The two nearly identical patterns on the mask essentially double expose the photoresist except for a 0.3 mil edge around all features, so that particles on either of the mask patterns will not significantly affect the final lead frame pattern formed in the photoresist. By not requiring the copper web to be moved during this process, the overlapping lead frame patterns can be aligned much more precisely by shifting the mask rather than by shifting the copper web.

13 Claims, 3 Drawing Sheets

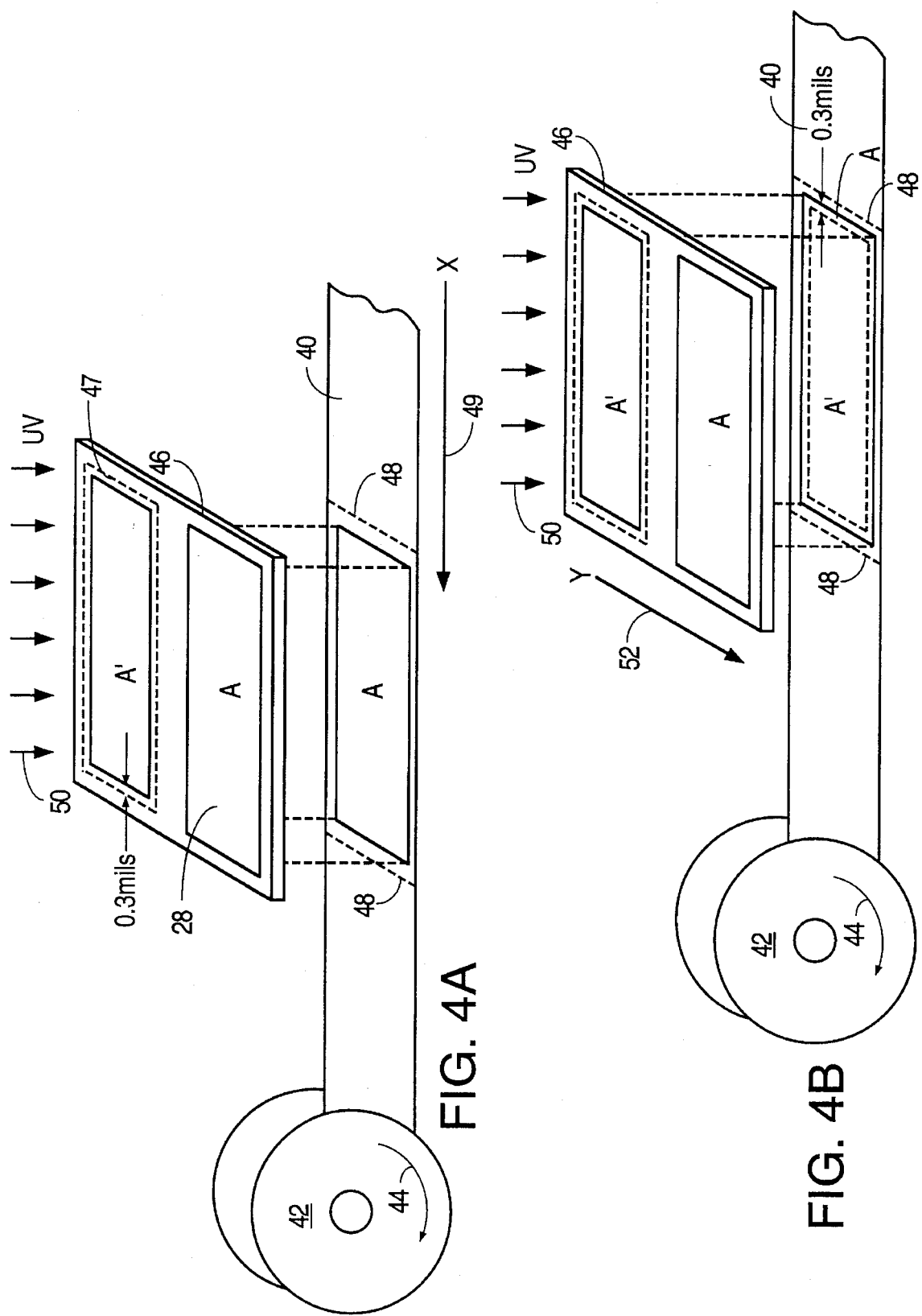

PHOTOLITHOGRAPHIC PROCESS FOR REDUCING REPEATED DEFECTS

FIELD OF THE INVENTION

This invention relates to photolithographic processes and, in particular, to a reel-to-reel photolithographic process which reduces the likelihood of repeated defects caused by particles on a mask.

BACKGROUND OF THE INVENTION

The present invention is applicable to virtually any photolithographic process. The inventive process is particular applicable to the fabrication of lead frames which provide the metal leads extending from a packaged integrated circuit.

FIG. 1 is a simplified plan view of a lead frame strip 10, having a typical length on the order of 9 inches and a width on the order of about 2 inches. Strip 10 may, however, be any width depending on the required size of a lead frame. Strip 10 is formed of copper or other metal and is generally 1–20 mils thick, depending upon the required ruggedness of the resulting leads of the integrated circuit package. Strip 10 has a number of repeated lead frame 12 patterns which are formed by either stamping or a photolithographic process. Each lead frame 12 pattern must be precisely formed and precisely aligned with respect to the other lead frame 12 patterns on strip 10 and with respect to the strip 10 itself in order for an automated bonding machine to centrally position an integrated circuit chip on each lead frame 12 and bond the pads of the integrated circuit chip to the leads 13 of the lead frame 12. After the chips are bonded to the lead frames 12, the individual lead frames 12 are separated from the strip 10, and the chips are encapsulated.

For high lead-count integrated circuits, a width of each of leads 13 may be only on the order of a few mils (e.g., 9 mils). A typical customer specification for the lead frames 12 requires each lead frame 12 to be formed within a tolerance of 1 mil and the alignment of the lead frame 12 patterns with respect to one another and with respect to strip 10 to be also within 1 mil to ensure reliability in the automated bonding process.

FIGS. 2A and 2B illustrate one existing method, developed by National Semiconductor Corporation, for forming the lead frame strips 10 using a photolithographic process.

A blank copper web 14 is generally supplied on a reel, where the copper web 14 may have a length around 500 feet. A photoresist layer is laminated onto the copper web 14.

A proximity type mask 16 is provided with a first chrome pattern 18 corresponding to one or more identical lead frame 12 patterns. Since a conventional mask 16 size is about 12 inches by 6 inches, the image formed by the first chrome pattern 18 (taking up almost one half the length of mask 16) exposes about half the 9 inch strip 10. Dashed lines 20 on copper web 14 identify where the web 14 will be eventually cut to form separate strips 10. Two exposure steps of pattern 18, requiring a shift of copper web 14, are thus required to expose the entire 9 inch copper strip 10 to pattern 18.

Due to the various mechanisms used to shift and align the copper web 14 under the mask 16, fine airborne particles of copper and other contaminants may alight upon the chrome pattern 18, causing repeated defects in the resulting lead frame 12 patterns. FIG. 2A illustrates a particle of dirt 22 residing at an edge of pattern 18. A second particle 23 is shown residing near the center of pattern 18. When the photoresist on copper web 14 is selectively exposed to ultraviolet radiation 24 through pattern 18, repeated defects 25 and 26 in the exposed photoresist pattern 27 are formed by particles 22 and 23, respectively. For simplicity of illustration, it will be assumed that the pattern 18 is a single, solid rectangle, when in actuality pattern 18 would contain a number of lead frame 12 patterns.

In an attempt to avoid such repeated defects in the lead frame 12 patterns, a second chrome pattern 28 on mask 16 is provided which is identical to pattern 18 but has feature dimensions reduced by 2 mils. The reduction in the feature dimensions by 2 mils takes into account a positional tolerance of the copper web 14 of approximately 1.5 mils when the copper web 14 is shifted in the X direction 30 to cause the exposed photoresist pattern 27 to be aligned directly under pattern 28, as shown in FIG. 2B.

The previously exposed photoresist pattern 27 is now partially double-exposed to ultraviolet radiation 24 through chrome pattern 28. Since the overlap of the pattern 28 image and the pattern 18 image leaves a border of 2 mils, the edge defect 25 remains but the centrally located defect 26 is eliminated by the exposure overlap. If mask 16 were used to form lead frames 12, edge defect 25 would represent a 2 mil defect in the edge of a resulting lead 13 as shown in FIG. 3.

The exposed photoresist is then developed, and the copper web 14 is subjected to an acid etch to remove the portions of the copper web 14 not covered by the photoresist. Assuming mask 16 contains lead frame 12 patterns, each lead frame 12 pattern in strip 10 of FIG. 1 would contain a faulty lead 13 (FIG. 3) having a pit 32 or notch 2 mils wide in a lead 13 which may be less than 9 mils wide. Thus, the resulting strip 10 would not meet the customer specification and would have to be discarded. It is Applicants' experience that such rejections occur approximately 5% of the time.

Additionally, due to the 1.5 mil positional accuracy of the copper web 14, the required repositioning of the copper web 14 to position the first photoresist pattern 27 under the second pattern 28 for each strip 10 causes the alignment of the lead frame 12 patterns in strip 10 to exceed the customer's typical tolerance of 1 mil approximately 5% of the time. This results in another 5% of strips 10 discarded, totalling a loss of 10% on the average.

What is needed is a more reliable photolithographic method for producing patterns using a mask, and particularly for producing lead frame patterns.

SUMMARY

A photolithographic process for forming a lead frame pattern or other pattern is described. In the preferred embodiment, a mask approximately 12 inches by 12 inches contains two nearly identical patterns: a first lead frame pattern is provided on one half of the mask, and a second lead frame pattern, having features reduced by 0.3 mil, is provided on the other half of the mask. The first pattern is positioned over a copper web having a layer of photoresist laminated on it, and ultraviolet light is transmitted through the first pattern. The photoresist is thus exposed by a first image formed by the first pattern. While the copper web remains stationary, the mask is moved perpendicular to the length of the copper web so that the second pattern now forms a second image overlying the photoresist pattern from the first image. The photoresist layer is then exposed by the second image. The two nearly identical patterns on the mask essentially double expose the photoresist except for a 0.3 mil edge around all features, so that particles on either of the mask patterns will not significantly affect the final lead frame pattern formed in the photoresist.

Since the copper web is not moved during this process, the overlapping photoresist patterns can be aligned much more precisely by shifting the mask rather than by shifting the copper web. The mask position can be aligned to within approximately 0.03 mil or less using interferometers or targets on the mask which are aligned with a reference target.

Since the feature sizes on the second pattern have only been reduced 0.3 mil, a maximum pit or other defect in the final lead frame pattern on the copper web caused by any particles on the mask will be a maximum of 0.33 mil (0.03+0.30 mil). Since the customer specification for a lead frame typically requires the smallest pit to be 1 mil or less, the above process should result in no rejected lead frame strips due to particles on the mask.

The above process is particularly suitable for forming lead frame strips in a copper web since a lead frame strip is typically on the order of 9 inches, and the first and second patterns can each exceed 9 inches so that a complete strip can be exposed without repositioning the copper web. This process can, however, be used for producing any patterns in a photolithographic process.

BRIEF DESCRIPTION OF THE DRAWINGS

FIGS. 4A and 4B illustrate the preferred method used for forming a lead frame strip.

DETAILED DESCRIPTION OF THE PREFERRED EMBODIMENTS

Figure 1:
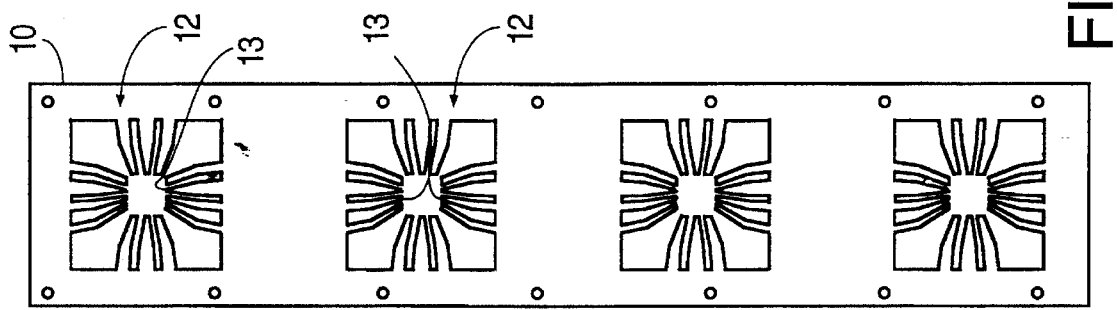
FIG. 1 is a plan view of a lead frame strip which may be formed using the present invention.
Figure 3:
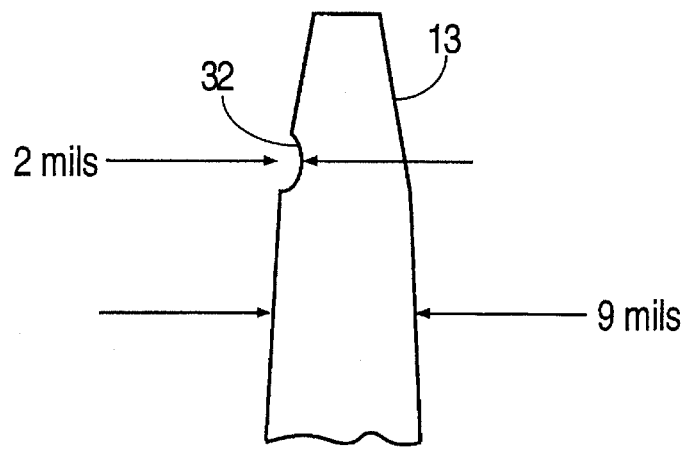
FIG. 3 is a magnified view of an end of a lead in a lead frame formed by the method of FIGS. 2A and 2B showing an unacceptable 2 mil notch or pit in the lead.
Figure 5:
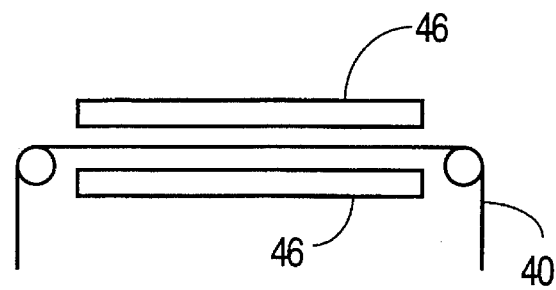
FIG. 5 is a simplified side view of the structure shown in FIGS. 4A and 4B illustrating the 2-sided exposure of the copper web.

FIGS. 4A, 4B, and 5 illustrate a preferred method for fabricating an improved lead frame strip 10, formed of a conductive material shown in FIG. 1, which limits any repeated defects in the lead frame patterns to less than about 0.6 mil, assuming a mask alignment to within 0.3 mil.

In FIG. 4A, a copper web 40 having a width of approximately 124 mm (5 inches) or less is provided on a first reel (not shown) and is taken up by a second reel 42 in the direction shown by arrow 44. Copper web 40 has a conventional photoresist layer laminated onto it prior to undergoing the process shown in FIGS. 4A and 4B. For purposes of illustration, the photoresist layer will be assumed to be negative photoresist, where exposure to ultraviolet radiation hardens the exposed portions of the photoresist, and these hardened portions remain after developing the photoresist. The unexposed portions of the photoresist, when removed, exposes the underlying copper, and this exposed copper is later etched using a conventional acid etchant.

To selectively expose the photoresist layer on copper web 40, a novel proximity or contact mask 46 is provided. Mask 46 contains a first pattern A and a second pattern A'. Patterns A and A', in one embodiment, are etched chrome patterns formed on a glass substrate using well known techniques. Pattern A' is identical to pattern A except with feature dimensions reduced by 0.3 mil. Dashed line 47 around pattern A' shows the dimensions of pattern A.

Preferably, mask 46 is approximately 12 inches by 12 inches. A lead frame strip, such as shown in FIG. 1, has a typical length of approximately 9 inches so that the image formed by each of patterns A and A' exposes an entire 9 inch strip of copper web 40 without any shifting of copper web 40. Dashed lines 48 show where the copper web 40 will be eventually cut to form individual lead frame strips. The number of individual lead frame 12 patterns in each of patterns A and A' may typically range from 6 to 24 or more lead frame patterns. To simplify illustration of the present invention, it will be assumed that patterns A and A' are each a solid rectangle, when in actuality patterns A and A' would each contain a number of lead frame patterns.

In a first step of the preferred embodiment process, a portion of copper web 40 is transported in the X direction shown by arrow 49 to position a section of copper web 40 under mask 46.

Pattern A is positioned directly over copper web 40, and a source of ultraviolet (UV) radiation 50 is then energized to selectively expose the photoresist on the surface of copper web 40 with the image of pattern A.

In the preferred embodiment, mask 46 is a contact or proximity type mask which needs no lens between the mask 46 and the copper web 40. In an alternative embodiment, mask 46 may be a reticle used in a projection system.

After the surface of copper web 40 has been exposed for a predetermined period of time, the UV source is turned off and the mask 46 is shifted in the Y direction 52, shown in FIG. 4B, so that pattern A' is now centered with respect to the previously formed pattern A on the copper web 40. The UV source is again energized to image the pattern A' upon the previously exposed surface of copper web 40 to double-expose the photoresist except for a 0.3 mil border around the features previously formed in the photoresist using pattern A. A reduction of 0.3 mil was chosen since the alignment accuracy of mask 46 in the Y direction 52 can be 0.3 mil or less using currently available techniques such as employing interferometers to position mask 46 or matching targets on mask 46 with reference targets. This alignment tolerance is much better than the 1.5 mil alignment tolerance of copper web 40 when moved in the X direction 49. If the alignment accuracy of mask 46 in the Y direction 52 is greater than 0.3 mil, than the feature dimensions in the pattern A' should be reduced by a corresponding amount to ensure that the image formed by pattern A' will not extend over the boundaries of the image formed by pattern A.

After the photoresist has been exposed for a predetermined period of time, the UV source is then turned off, and the copper web 40 is shifted in the X direction 49 to expose a next strip portion under mask 46. Mask 46 may be kept in place to first expose the copper web 40 to pattern A' and then shifted in a direction opposite direction 52 to then expose the copper web 40 to the pattern A. Alternately, the mask 46 may be reset to its initial position as shown in FIG. 4A.

In the preferred embodiment, the copper web 40 is exposed to identical patterns on identical masks 46 on both sides of the copper web 40, as illustrated by the simplified diagram of FIG. 5. In this way, after the photoresist is developed and removed, the copper not covered by photoresist may be etched on both sides of the copper web 40, creating more precisely formed lead frames 12. Also, etching both sides of copper web 40 results in a quicker etching time for forming the lead frames 12.

Figure 6:
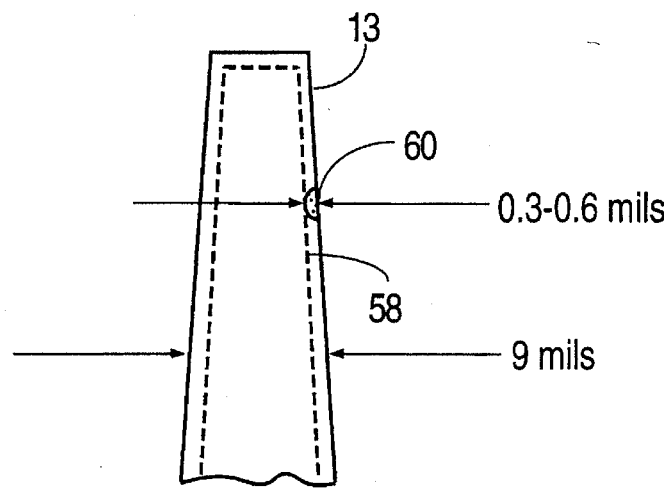
FIG. 6 is magnified end of a lead in a lead frame formed by the method of FIGS. 4A and 4B illustrating a notch or pit of 0.3 mil, which has virtually no detrimental effect on the resulting lead frame operation.

FIG. 6 is a magnified view of an end of one lead 56 which may correspond to any of leads 13 in FIG. 1. The lead 56 is outlined with a solid line corresponding to the image formed by pattern A, and the pattern A' is superimposed upon lead 56 as illustrated by dashed line 58. The 0.3 mil gap in the patterns A and A' occurs when the shifting of mask 46 in the Y direction 52 is ideal. If the positional alignment of mask 46 was off 0.3 mil from the ideal, then a 0.6 mil gap would exist between one edge of the image pattern A' and the image pattern A.

Assuming particles of dirt or copper were present on portions of pattern A in FIG. 4A, the double exposure of the photoresist by pattern A' would effectively erase any defect in the image pattern A. However, if a particle existed at an edge of any of the features in pattern A, then this edge would not have been double exposed by the reduced pattern A'. But, since pattern A' has dimensions reduced by only 0.3 mil, any pits or notches, such as pit 60 in FIG. 6, will only have a maximum width of 0.6 mil if the mask 46 alignment in the Y direction 52 was off by an assumed maximum of 0.3 mil. This maximum pit of 0.6 mil is less than the typical 1 mil tolerance specified by the customer, and no losses would result by the existence of pit 60.

Figure 2A:
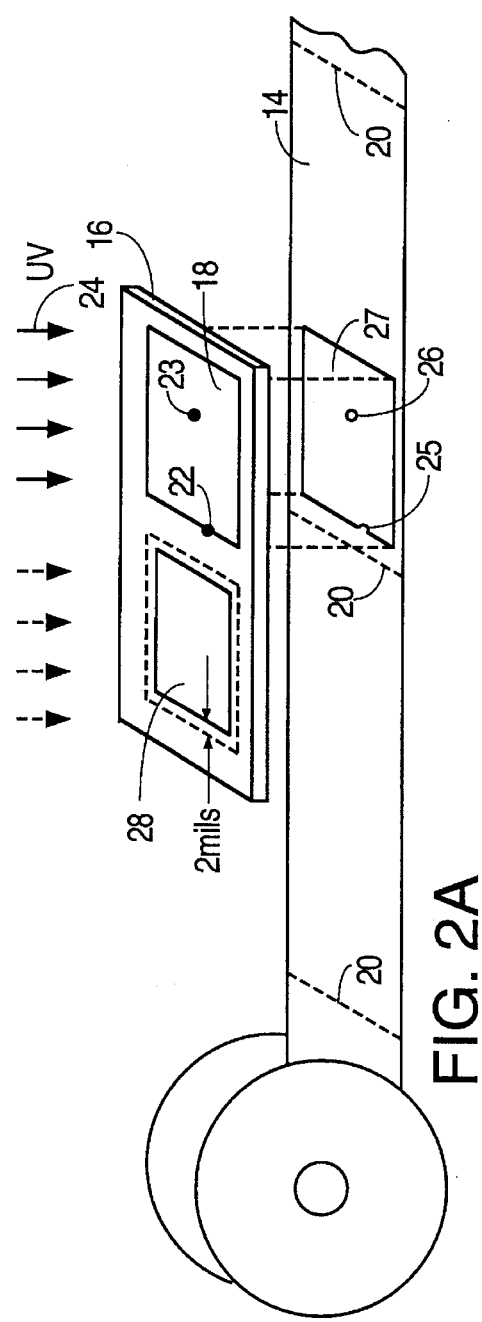
FIG. 2A and 2B illustrate one existing method used by the Applicants in an attempt to eliminate repeating defects in lead frame strips caused by particles on a mask.
Figure 2B:
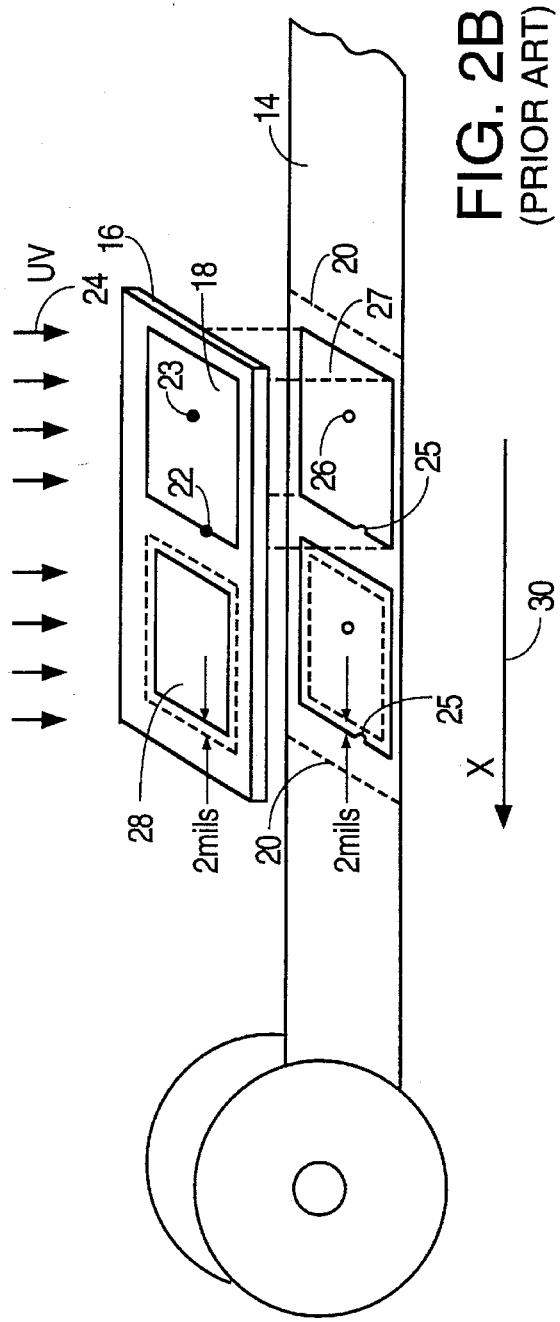

Depending on the alignment tolerance of mask 46, the reduction in feature dimensions in pattern A' can be anywhere between 0.05 mil to 1 mil and still result in an improvement over the method of FIGS. 2A and 2B. In one embodiment, the dimensions in pattern A' are reduced from 0.3 mil to 0.5 mil.

The above process may be applied to any photolithographic process independent of the patterns to be imaged on a target. The target may be a semiconductor wafer or any other target to be patterned using a photolithographic process. Additionally, the source of radiation may be a laser or any other source.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A photolithographic method comprising the steps of:

providing a target having a surface which is to be selectively patterned by masked radiation;

positioning a mask in a first position with respect to said surface, said mask having a first mask pattern having first features and having a second mask pattern having second features substantially identical to said first features but adjusted in size by a first amount, positioning said mask in said first position causing said first mask pattern to be imaged on said surface;

energizing a source of said radiation to radiate said surface through said first mask pattern for a period of time to form a first exposure pattern on said surface;

positioning said mask in a second position with respect to said surface such that said second mask pattern is aligned with said first exposure pattern on said surface; and energizing said source of said radiation to radiate said surface through said second mask pattern for a period of time so as to double-expose said surface where a second exposure pattern from said second mask pattern overlaps said first exposure pattern, wherein said target remains stationary during and between said steps of positioning said mask in said first position and positioning said mask in said second position.

2. The method of claim 1 wherein said second mask pattern has said second features reduced in size from a size of said first features.

3. The method of claim 2 wherein said second features are reduced in size from said first features by approximately 0.05 mil to 1 mil.

4. The method of claim 3 wherein said second features are reduced in size from said first features by approximately 0.3 mil to 0.5 mil.

5. The method of claim 1 wherein said second mask pattern has said second features enlarged in size from a size of said first features.

6. The method of claim 5 wherein said second features are enlarged in size from said first features by approximately 0.05 mil to 1 mil.

7. The method of claim 6 wherein said second features are enlarged in size from said first features by approximately 0.3 mil to 0.5 mil.

8. The method of claim 1 wherein said target comprises a strip of conductive material, and wherein said first mask pattern and said second mask pattern contain lead frame patterns to form lead frames for connection to integrated circuit chips.

9. The method of claim 8 wherein said conductive material is positioned under said mask by shifting said conductive material in an X direction and said mask is shifted from said first position to said second position in a Y direction substantially perpendicular to said X direction.

10. The method of claim 9 wherein said conductive material is provided on a reel and shifted under said mask using a reel-to-reel transport system.

11. The method of claim 1 wherein said mask is positioned proximate to said target surface.

12. The method of claim 1 wherein said source of radiation is a source of ultraviolet radiation.

13. The method of claim 1 further comprising a layer of photoresist on said surface of said target.

\* \* \* \* \*